(12) United States Patent
Saito et al.

(10) Patent No.: US 10,429,907 B2
(45) Date of Patent: Oct. 1, 2019

(54) COOLING STRUCTURE FOR PORTABLE ELECTRONIC DEVICE

(71) Applicant: FUJIKURA LTD., Tokyo (JP)

(72) Inventors: Yuji Saito, Tokyo (JP); Mohammad Shahed Ahamed, Tokyo (JP); Makoto Takahashi, Tokyo (JP); Akihiro Takamiya, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 26 days.

(21) Appl. No.: 15/036,081

(22) PCT Filed: Oct. 27, 2014

(86) PCT No.: PCT/JP2014/078457
§ 371 (c)(1),
(2) Date: May 12, 2016

(87) PCT Pub. No.: WO2015/072315
PCT Pub. Date: May 21, 2015

(65) Prior Publication Data
US 2016/0282914 A1  Sep. 29, 2016

(30) Foreign Application Priority Data
Nov. 14, 2013 (JP) ................. 2013-236033

(51) Int. Cl.
*G06F 1/20* (2006.01)
*H05K 7/20* (2006.01)
(Continued)

(52) U.S. Cl.
CPC ......... *G06F 1/203* (2013.01); *F28D 15/0266* (2013.01); *F28D 15/043* (2013.01);
(Continued)

(58) Field of Classification Search
CPC .. G06F 1/203; H05K 7/20336; H04M 1/0202; F28D 15/0266; F28D 15/043; F28D 15/046; H01L 23/427; F28F 3/086
(Continued)

(56) References Cited

U.S. PATENT DOCUMENTS 8,625,279 B2 * 1/2014 Hata ................. G06F 1/203
165/104.33
2004/0184236 A1 * 9/2004 Lee ................... H01L 23/427
361/697
(Continued)

FOREIGN PATENT DOCUMENTS

CN  201197254 Y  2/2009
JP  1-174993 U  12/1989
(Continued)

OTHER PUBLICATIONS

Japanese Office Action for JP 2013-236033 dated Sep. 24, 2014.
(Continued)

*Primary Examiner* — Keith M Raymond
*Assistant Examiner* — Gordon A Jones
(74) *Attorney, Agent, or Firm* — Sughrue Mion, PLLC (57) ABSTRACT

A cooling structure for a portable electronic device is provided, configured to accommodate, within a case having a sealing structure, a substrate on which a heat-generating component that generates heat during operation is mounted, and provided with a heat sink that diffuses the heat from the heat-generating component to a place away from the heat-generating component. The heat sink is integrated into an inner surface of an area corresponding to a front cover of the case or an inner surface of an area corresponding to a rear cover of the case, and a flat heat pipe flattened by being compressed in a thickness direction of the case is disposed such that one end is attached by being sandwiched between
(Continued)

the heat-generating component and the heat sink while another end is arranged in close contact with the heat sink.

12 Claims, 3 Drawing Sheets

(51) Int. Cl.
| | |
|---|---|
| H04M 1/02 | (2006.01) |
| F28D 15/02 | (2006.01) |
| F28F 3/08 | (2006.01) |
| F28D 15/04 | (2006.01) |
| H01L 23/427 | (2006.01) |

(52) U.S. Cl.
CPC ............ *F28D 15/046* (2013.01); *F28F 3/086* (2013.01); *H01L 23/427* (2013.01); *H05K 7/20336* (2013.01); *H04M 1/0202* (2013.01)

(58) Field of Classification Search
USPC .................................................... 165/104.33
See application file for complete search history.

(56) References Cited

U.S. PATENT DOCUMENTS

| | | | | |
|---|---|---|---|---|
| 2006/0126304 | A1* | 6/2006 | Smalc | G06F 1/203 |
| | | | | 361/704 |
| 2008/0191341 | A1* | 8/2008 | Nishiyama | G06F 1/203 |
| | | | | 257/719 |
| 2010/0079953 | A1* | 4/2010 | Okutsu | G06F 1/203 |
| | | | | 361/700 |
| 2010/0291381 | A1* | 11/2010 | Elia | C23C 18/1641 |
| | | | | 428/339 |
| 2011/0297355 | A1* | 12/2011 | Meyer, IV | F28D 15/0233 |
| | | | | 165/104.26 |
| 2012/0056789 | A1* | 3/2012 | Sohn | H01Q 1/242 |
| | | | | 343/702 |
| 2013/0329357 | A1* | 12/2013 | Degner | H05K 5/02 |
| | | | | 361/679.47 |
| 2014/0160671 | A1* | 6/2014 | Yang | G06F 1/203 |
| | | | | 361/679.47 |
| 2014/0340841 | A1* | 11/2014 | Yu | G06F 1/203 |
| | | | | 361/679.47 |

FOREIGN PATENT DOCUMENTS

| | | | |
|---|---|---|---|
| JP | 11-294981 | A | 10/1999 |
| JP | 2001035979 | A | 2/2001 |
| JP | 2007149855 | A | 6/2007 |
| JP | 2011-3604 | A | 1/2011 |
| JP | 2011-47593 | A | 3/2011 |
| JP | 2001-135966 | A | 5/2011 |
| JP | 2011-119474 | A | 6/2011 |
| JP | 3180462 | U | 12/2012 |
| KR | 201999009956 | U | 3/1999 |
| KR | 2019990019654 | U | 6/1999 |
| TW | 459692 | U * | 8/2013 ............ G06F 1/203 |
| WO | 2012/008398 | A1 | 1/2012 |

OTHER PUBLICATIONS

Communication dated Apr. 22, 2016, from the Korean Intellectual Property Office in corresponding Korean application No. 10-2016-7009218.

Communication dated Mar. 24, 2017 from the State Intellectual Property of the P.R.C. in counterpart application No. 201480062031.8.

* cited by examiner

COOLING STRUCTURE FOR PORTABLE ELECTRONIC DEVICE

CROSS REFERENCE TO RELATED APPLICATIONS

This application is a National Stage of International Application No. PCT/JP2014/078457 filed Oct. 27, 2014, claiming priority based on Japanese Patent Application No. 2013-236033 filed Nov. 14, 2013, the contents of all of which are incorporated herein by reference in their entirety.

TECHNICAL FIELD

The present invention relates to a structure that cools a portable electronic device such as a multi-function mobile phone (smartphone) and a tablet-type personal computer by promoting heat radiation therefrom.

BACKGROUND ART

The amount of heat generated within this type of electronic device has increased with an improvement in processing capability, and requires a lowering of the temperature of a hot spot more than ever to prevent a decrease in performance and damage. Furthermore, a reduction in the thickness, size, or weight is demanded to enhance portability. In order to provide a heat sink capable of satisfying such a request, for example, Japanese Unexamined Patent Application, First Publication No. 2011-3604 discloses a heat sink with low thermal resistance capable of enhancing assembling accuracy and also saving installation space. The heat sink includes a plate member corresponding to a main body, a recessed portion formed in the plate member, and a groove formed extending toward the outside from the inside of the recessed portion. A heat pipe is fit into the groove, while a thermal conductive member formed into a shape similar to that of the recessed portion is fit into the recessed portion and processed such that a surface of the thermal conductive member is aligned to a surface of the plate member corresponding to the main body so as to be flush.

The plate member corresponding to the main body of the heat sink disclosed in Japanese Unexamined Patent Application, First Publication No. 2011-3604 described above needs to have a thickness obtained by adding a thickness allowing the recessed portion to be formed such that the thermal conductive member is fit thereinto, a thickness allowing the groove to be formed in an area of the recessed portion corresponding to a so-called bottom surface such that the heat pipe is fit thereinto, and a residual thickness required for predetermined strength of the groove on a so-called bottom portion side. Accordingly, the entire thickness of the heat sink is necessarily made thicker. Moreover, because the groove has a structure for fitting thereinto the beat pipe with a cross-sectional circular shape, the thickness is made still thicker. For example, since a graphite sheet is used in the multi-function mobile phone to transfer heat within a case thereof, respective components are required to be as thin as possible. Therefore, it is difficult to employ the heat sink disclosed in Japanese Unexamined Patent Application, First Publication No. 2011-3604 for the portable electronic device.

DISCLOSURE OF INVENTION

The present invention has been made in consideration of the above-mentioned circumstances and an object thereof is to provide a cooling structure that enhances a heat transfer property or a heat radiation property over the conventional one to thereby effectively function in lowering of the temperature at a hot spot.

In order to achieve the aforementioned object, the present invention provides a cooling structure for a portable electronic device configured to accommodate, within a case having a sealing structure, a substrate on which a heat-generating component that generates heat during operation is mounted, and provided with a heat sink that diffuses the heat from the heat-generating component to a place away from the heat-generating component, in which the heat sink is integrated into an inner surface of an area corresponding to a front cover of the case or an inner surface of an area corresponding to a rear cover of the case, and a flat heat pipe flattened by being compressed in a thickness direction of the case is disposed such that one end of the flat heat pipe is attached by being sandwiched between the heat-generating component and the heat sink while another end of the flat heat pipe is in close contact with the heat sink.

In such a configuration, a gap formed by the flat heat pipe when being attached by being sandwiched between the heat-generating component and the heat sink may be filled with a thermal conductive material.

As a result, heat is transferred to the heat sink from the heat-generating component via the heat pipe and in turn radiated to the outside from the heat sink through the front cover or the rear cover. Therefore, because a large amount of heat can be transferred to the heat sink to cool the heat-generating component, even in a case where the heat remains in the periphery of the heat-generating component and thus the temperature is slightly raised, the increase in the temperature can be suppressed, thereby clearing the hot spot or lowering the temperature of the hot spot. In addition, this heat pipe is flattened in the thickness direction of the case. Accordingly, a reduction in thickness and size can be achieved in the portable electronic device. Particularly, the aforementioned heat pipe is configured such that the one end is attached by being sandwiched between the heat-generating component and the heat sink to reduce thermal resistance between the heat-generating component and the heat pipe. As a result, thermal resistance between the heat-generating component and the heat sink, in particular, between the heat-generating component and a place from which heat is radiated is also reduced, whereby the dispersion of heat during formation of the heat-generating component is promoted such that the temperature of the hot spot can be lowered.

Additionally, by using the thermal conductive material described above, the heat radiation from the heat-generating component can be further promoted.

The invention also provides a cooling structure for a portable electronic device configured to accommodate, within a case having a sealing structure, a substrate on which a heat-generating component that generates heat during operation is mounted, and provided with a heat sink that diffuses the heat from the heat-generating component to a place away from the heat-generating component, in which the heat sink is integrated into an inner surface of an area corresponding to a front cover of the case or an inner surface of an area corresponding to a rear cover of the case, and a flat heat pipe flattened by being compressed in a thickness direction of the case is disposed such that one flat portion at one end of the flat heat pipe is coupled to the heat-generating component through a heat transfer sheet being in close contact with the heat sink and the heat-generating component, while another flat portion of the flat heat pipe is in close contact with the heat sink.

In such a configuration, a portion of the heat transfer sheet may extend toward a side portion of the heat-generating component while being separated from the heat sink and the one flat portion of the flat heat pipe may be attached by being sandwiched between the portion of the heat transfer sheet and the heat sink.

As a result, the heat-generating component and the one end of the heat pipe are configured to be coupled to each other through the heat transfer sheet made of graphite, metal, or the like. Therefore, the thermal resistance between the heat-generating component and a place in the heat sink from which heat is radiated can be reduced. In addition to this, because the heat-generating component and the heat pipe do not need to overlap when being arranged, a reduction in thickness can be achieved in the portable electronic device.

The invention also provides a cooling structure for a portable electronic device configured to accommodate, within a case having a sealing structure, a substrate on which a heat-generating component that generates heat during operation is mounted, and provided with a heat sink that diffuses the heat from the heat-generating component to a place away from the heat-generating component, in which the heat sink is integrated into an inner surface of an area corresponding to a front over of the case or an inner surface of an area corresponding to a rear cover of the case while being in contact with a top surface of the heat-generating component such that heat is transferable, and a flat heat pipe flattened by being compressed in a thickness direction of the case is disposed such that one end of the flat heat pipe is positioned toward a place in the heat sink which is in contact with the heat-generating component and also bonded to the heat sink so as to receive the heat from the heat-generating component through the heat sink, while another end of the flat heat pipe is in close contact with a place in the heat sink further away from the place in the heat sink which is in contact with the heat-generating component than the one end.

As a result, the one end of the heat pipe is configured to be bonded to the heat sink such that the heat is transferred between the heat-generating component and the heat pipe through the heat sink. Therefore, the number of required components is reduced, whereby a reduction in size and weight can be achieved in the portable electronic device while also attaining a reduction in thickness.

The invention also provides a cooling structure for a portable electronic device configured to accommodate, within a case having a sealing structure, a substrate on which a heat-generating component that generates heat during operation is mounted, and provided with a heat sink that diffuses the heat from the heat-generating component to a place away from the heat-generating component, in which the heat sink is integrated into an inner surface of an area corresponding to a front cover of the case or an inner surface of an area corresponding to a rear cover of the case, and a flat heat pipe flattened by being compressed in a thickness direction of the case is disposed such that one end of the flat heat pipe is arranged at a position for receiving the heat from the heat-generating component and another end of the flat heat pipe is arranged so as to be in close contact with the heat sink, the cooling structure for the portable electronic device further including a shield plate covering a top surface side of the heat-generating component, the shield plate including a stepped portion bent toward the substrate such that a thickness of the shield plate is smaller than a thickness of the heat-generating component at a place shifted away from the heat-generating component in a width direction or a length direction of the heat-generating component, the one end of the flat heat pipe being sandwiched between the stepped portion and the heat sink.

As a result, the shield plate for the heat-generating component is configured to include the stepped portion and the one end of the heat pipe is configured to be sandwiched between that stepped portion and the heat sink. Therefore, the existing shield plate can be used to transfer heat between the heat-generating component and the heat pipe, whereby the number of required components is reduced. Consequently, a reduction in size and weight can be achieved in the portable electronic device while also attaining a reduction in thickness.

Meanwhile, according to the invention, the heat sink may have a thinner plate thickness at a place where the flat heat pipe is bonded than a thickness at a place where the flat heat pipe is not bonded.

The plate thickness at a place where the flat heat pipe is bonded can be made thinner by forming a groove in the heat sink. In addition, the groove may be formed by reducing thicknesses of side edge portions of divided plates adjacent to each other.

As a result, the plate thickness of the heat sink to which the heat pipe is bonded is configured not to be uniform such that the plate thickness at a place where the heat pipe is bonded is made thinner than the plate thicknesses in other areas. Therefore, an increase in the entire thickness at a place where the heat sink overlaps the heat pipe can be suppressed, whereby a reduction in thickness can be achieved in the portable electronic device.

Furthermore, in addition to any of the aforementioned configurations, the invention can be configured such that the case is formed using synthetic resin, the heat sink is formed using metal, and the heat sink is built into a portion of the case so as to be integrated into the case while a portion of the heat sink is exposed to the outside of the case.

In the configuration of the heat sink integrated into a portion of the case made of synthetic resin using insert molding, the number of components overlapping in the thickness direction can be reduced in the portable electronic device, whereby a reduction in thickness can be achieved in the portable electronic device. At the same time, the heat sink can be exposed to the outside and thus a heat radiation effect or a cooling effect can be enhanced.

The invention enhances a heat transfer property or a heat radiation property in a portable electronic device such as a multi-function mobile phone and a tablet-type personal computer over the conventional structure to promote heat radiation therefrom, thereby effectively functioning to lower the temperature of a hot spot.

EMBODIMENTS FOR CARRYING OUT THE INVENTION

Figure 1:
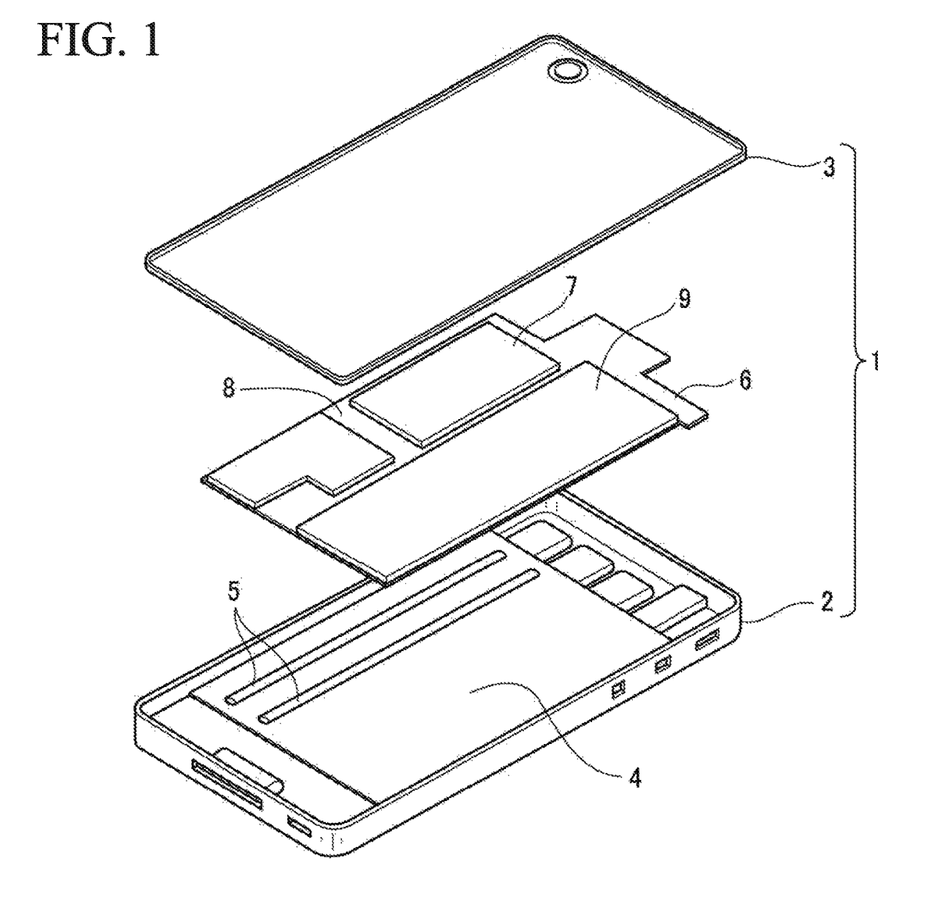
FIG. 1 is an exploded perspective view schematically illustrating an example of a portable electronic device including a cooling structure according to the invention.

A cooling structure according to the invention is used for portable electronic device and configured to disperse heat generated from a heat-generating component such as a CPU and then radiate the heat to the outside, thereby clearing a hot spot or lowering a maximum temperature of the hot spot. Examples of the portable electronic device include a multi-function mobile phone (so-called smartphone) and a tablet-type personal computer. FIG. 1 schematically illustrates an example of the multi-function mobile phone. A case 1 includes a main body 2 into which a front cover is integrated and a rear cover 3 fit into a rear surface side of the main body 2, where the main body 2 and the rear cover 3 are configured to seal the inside. An area corresponding to the front cover in the main body 2 is constituted by a liquid crystal panel (not illustrated) and serves as a display. A heat sink 4 is disposed on an inner surface of the area corresponding to the front cover so as to be in close contact therewith (integrated thereinto). The heat sink 4 disperses heat within the case 1 while diffusing the heat to the outside through the case 1. The heat sink 4 is formed into a thin plate shape using metal such as stainless steel, copper, or aluminum.

A flat heat pipe 5 is arranged on one surface of the heat sink 4 (a surface on an opposite side of a surface on the front cover side) so as to be in close contact therewith. The flat heat pipe 5 is a thermal conductive element formed by enclosing, within a thin flat pipe having a thickness of 1 mm or less (e.g., 0.7 mm or the like), a working fluid such as water that transfers heat as evaporation latent heat and a wick that generates capillary pressure during permeation of the working fluid in a liquid phase thereinto (both of the members are not illustrated). The thickness is not necessarily required to be uniform across the entire body; a thickness on one end side and a thickness on another end side may differ from each other. In the flat heat pipe 5, when a difference in temperature occurs between the one end and the other end, the working fluid evaporates and the vapor flows to a low temperature side. Thereafter, the vapor radiates heat and condenses to transfer the heat as evaporation latent heat. The pipe (container) constituting the heat pipe 5 is made of metal such as copper. The heat pipe 5 is affixed to the heat sink 4 through solder, an adhesive, or a double-sided adhesive tape. Alternatively, the heat pipe 5 may be fixed to the heat sink 4 by caulking a portion of the heat sink 4.

A substrate 6 is equipped in the inside of the case 1. An electronic component 7 such as a CPU and various types of memory elements is mounted on the substrate 6. In particular, among these electronic components, a CPU which generates heat during calculation corresponds to the heat-generating component according to the invention. In the example illustrated in FIG. 1, another electronic component 8 such as a connector and a battery 9 are attached to the substrate 6. The substrate 6 is disposed on a surface of the heat sink 4 on a side to which the heat pipe 5 is attached. When being arranged, the one end of the heat pipe 5 is in contact with the electronic component 7 such as the CPU or positioned close thereto, while the other end thereof is positioned on a side of the electronic component 8 that does not generate heat or on a side of the electronic component 8 that generates a small amount of heat, or alternatively, positioned on a side of the battery 9.

The heat sink 4, the substrate 6, and the like are accommodated in the main body 2 as described above and then the rear cover 3 is attached to the main body 2 in this state to seal the case 1. When a switch (not illustrated) is turned on to operate, an amount of generated heat grows larger in accordance with an increase in an amount of calculation at the CPU. The heat is dispersed to the surroundings through thermal conduction, thermal radiation, and the like, and also dispersed to a place away from the heat-generating component or the entire inside of the case 1 through the heat sink 4. The heat pipe 5 is attached to the heat sink 4 so as to be in close contact therewith. The one end of the heat pipe 5 is in contact with the heat-generating component or arranged in the vicinity of the heat-generating component (on a side of a place in the heat sink 4 which is in contact with the heat-generating component), while the other end thereof extends toward a place away from the heat-generating component. Accordingly, heat generated from the heat-generating component is transferred to an area at a low temperature away from the heat-generating component through the heat pipe 5 as well. As described above, because the heat pipe 5 transfers heat as evaporation latent heat of the working fluid, the apparent thermal conductivity of the heat sink 4 to which the heat pipe 5 is attached is enhanced. Thus, a difference between the temperature at the vicinity of the heat-generating component and the temperature at a place away from the heat-generating component is reduced. As a result, the hot spot in the vicinity of the heat-generating component can be cleared, or alternatively, the temperature of the hot spot can be made lower than ever. Therefore, degradation of function can be avoided or suppressed in the electronic component such as the CPU, or alternatively, the performance of the electronic component can be improved. Additionally, the heat pipe 5 has a thickness of approximately 1 mm or less and thus can be arranged in a residual space within the case 1. Thus, according to the invention, the performance of the portable electronic device can be enhanced while achieving a reduction in thickness.

Figure 2:
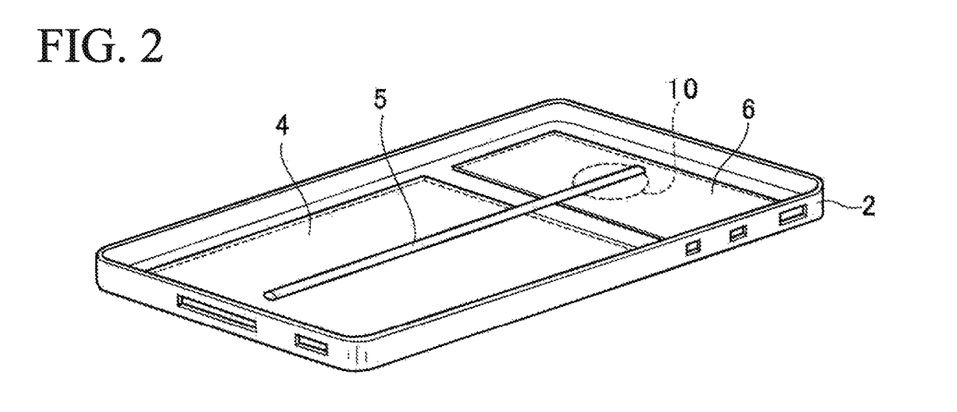
FIG. 2 is a schematic view illustrating an exemplary arrangement of a heat pipe according to the invention.

Note that the sizes and the shapes of the substrate 6 and the battery 9 described above or the arrangements thereof are different depending on performance or a function required for the portable electronic device. The shape and the position of the flat heat pipe 5 according to the invention can be changed as necessary depending on the arrangements of the substrate 6 and the battery 9. As illustrated in the example in FIG. 2, in a configuration where the substrate 6 on which a heat-generating component 10 such as the CPU is mounted is formed within a relatively small area and the battery 9 is arranged in parallel thereto, the heat sink 4 is disposed so as to cover the battery 9. The heat pipe 5 is arranged so as to be in close contact with the heat sink 4, while the one end of the heat pipe 5 is extended toward a side of the heat-generating component 10 such that heat is transferred between the heat-generating component 10 and the heat pipe 5.

Figure 3:
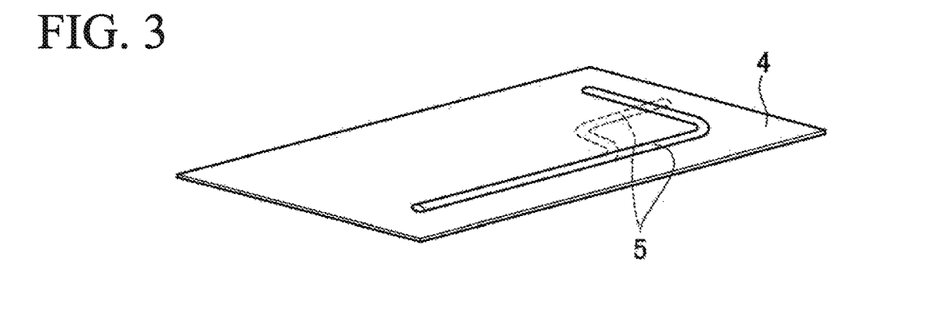
FIG. 3 is a schematic view illustrating another example of the heat pipe.

In addition, the heat pipe 5 can be formed into a shape in accordance with a residual space within the case 1 or a shape for preventing interference with other components. Examples of the shape are illustrated in FIG. 3; a suitable shape such as a crank shape or an L shape can be employed. In any of these shapes, the one end of the heat pipe 5 is arranged at a position allowing the one end thereof to be in contact with the heat-generating component 10 or in the vicinity of the heat-generating component 10.

Figure 4:
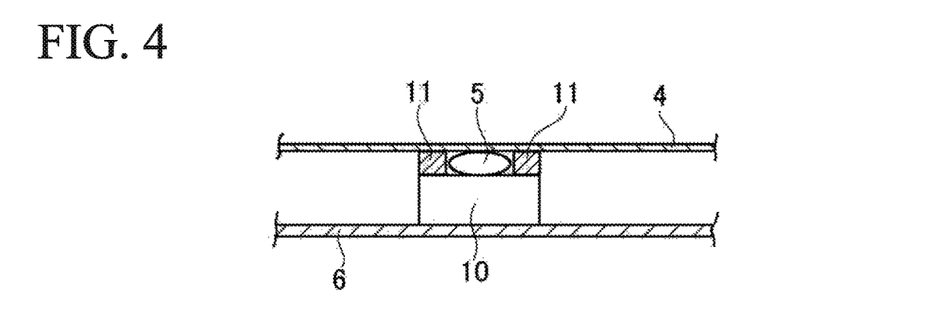
FIG. 4 is a partial view explaining an example where one end of the heat pipe is in close contact with a top surface of a heat-generating component.

In the invention, the flat heat pipe 5 may be used to increase the apparent thermal conductivity of the heat sink 4, or alternatively, the heat pipe 5 may be used to promote the heat transfer to the heat sink 4 from the heat-generating component 10. The latter case is configured such that heat is transferred to both of the heat sink 4 and the heat pipe 5 from the heat-generating component 10. In this case, the following configuration can be employed. FIG. 4 illustrates an example where the one end of the heat pipe 5 is sandwiched between a top surface of the heat-generating component 10 (a surface on an opposite side of the substrate 6) and the heat sink 4. Considering that the heat pipe 5 can be affixed to the heat sink 4 in advance, this configuration allows the heat sink 4 to be placed on the top surface side of the heat-generating component 10 from above such that the one end of the heat pipe 5 is in close contact with the top surface of the heat-generating component 10. The width or the length of the heat-generating component 10 is long compared to the width of the one end of the heat pipe 5 and thus a thermal conductive material (thermal interface material: TMI) 11 is arranged or injected between the top surface of the heat-generating component 10 and the heat sink 4 in addition to the one end of the heat pipe 5. The thermal conductive material 11 may be conventionally known thermal grease or a thermal pad. According to the configuration illustrated in FIG. 4, the heat pipe 5 is in substantially direct contact with the heat-generating component 10 to reduce thermal resistance between the two. As a result, heat generated from the heat-generating component 10 can be transferred more efficiently to the heat sink 4 or a place at a low temperature, whereby the temperature of the hot spot can be further lowered.

Figure 5:
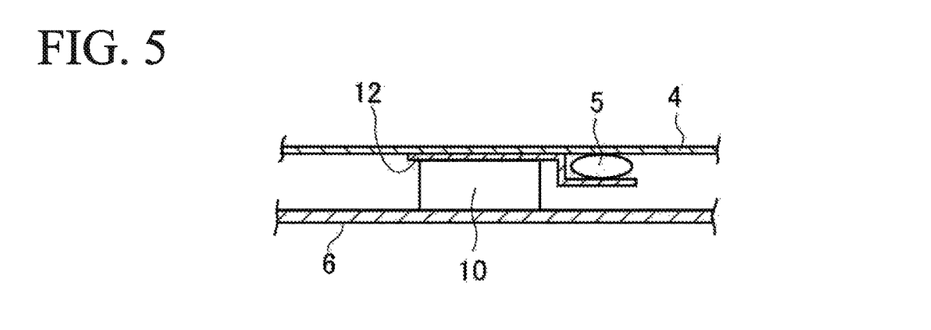
FIG. 5 is a partial view illustrating an example where the one end of the heat pipe is coupled to the heat-generating component through a heat transfer sheet.

FIG. 5 illustrates an example where a heat transfer sheet 12 made of graphite is sandwiched between the top surface of the heat-generating component 10 and the heat sink 4, and at least one end of the heat transfer sheet 12 is extended to a side portion of the heat-generating component 10 such that the one end of the heat pipe 5 is sandwiched between the extended area of the heat transfer sheet 12 and the heat sink 4. Specifically, one flat portion of the heat pipe 5 (a planar surface on a bottom side in FIG. 5) is in close contact with the heat transfer sheet 12, while another flat portion (a planar surface on a top side in FIG. 5) is in close contact with the heat sink 4. According to the configuration illustrated in FIG. 5, the heat transfer sheet 12 transfers heat to the heat pipe 5 from the heat-generating component 10 to reduce thermal resistance between the two. As a result, the heat can be efficiently radiated from the heat-generating component 10, thereby cooling the heat-generating component 10. Additionally, the heat-generating component 10 does not overlap the heat pipe 5 in the thickness direction, whereby the entire thickness of the portable electronic device can be made thinner.

Figure 6:
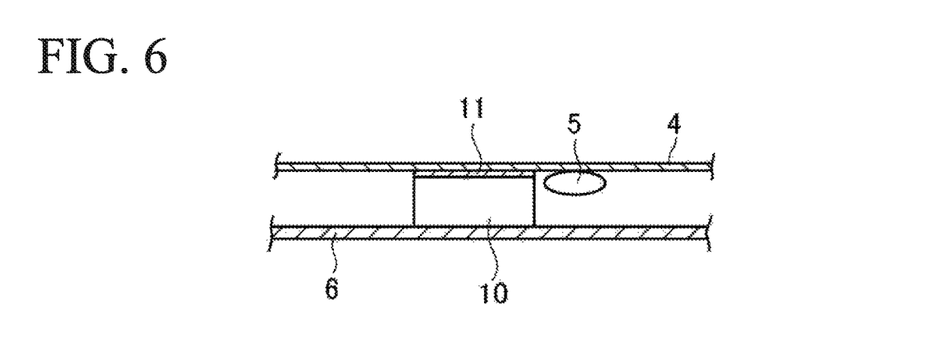
FIG. 6 is a partial view illustrating an example where the one end of the heat pipe is arranged in the vicinity of the heat-generating, component.

FIG. 6 illustrates an example where the one end of the heat pipe 5 attached to the heat sink 4 is configured so as to be positioned in the vicinity of the heat-generating component 10. The aforementioned thermal conductive material 11 is arranged or injected between the top surface of the heat-generating component 10 and the heat sink 4. According to the configuration illustrated in FIG. 6, the heat-generating component 10 is coupled to the one end of the heat pipe 5 through the thermal conductive material 11 and the heat sink 4 instead of being in direct contact therewith. Accordingly, heat from the heat-generating component 10 is transferred to the heat pipe 5 through the thermal conductive material 11 and the heat sink 4. In addition, because the one end of the heat pipe 5 is arranged close to the heat-generating component 10, a large amount of heat is transferred to the heat pipe 5 from the heat-generating component 10 due to thermal radiation. Therefore, according to the configuration illustrated in FIG. 6, a reduction in thickness can be achieved in the portable electronic device without particularly degrading the performance of radiating heat from the heat-generating component 10 or the performance of cooling the heat-generating component 10.

Figure 7:
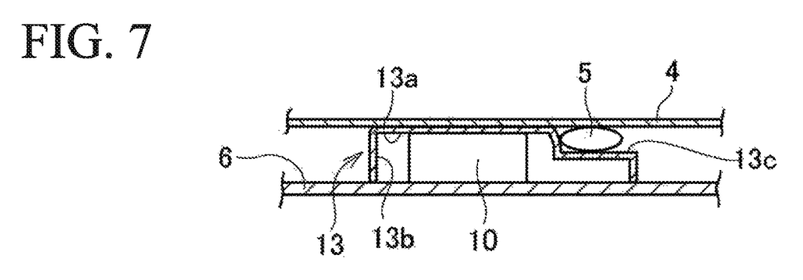
FIG. 7 is a partial view illustrating an example where the one end of the heat pipe is sandwiched between a shield plate and a heat sink.

Furthermore, FIG. 7 illustrates an example where a shield plate 13 is used. The shield plate 13 is a plate-shaped member made of metal and attached to the substrate 6 while covering the heat-generating component 10 such as the CPU to prevent electromagnetic influence. The shield plate 13 includes a top surface portion 13a being in close contact with the top surface of the heat-generating component 10 and attached by being sandwiched between the heat sink 4 and the top surface of the heat-generating component 10, and a leg portion 13b coupled to the substrate 6. An area extending from the top surface portion 13a in the width direction or the length direction of the heat-generating component 10 is bent in a crank shape in a cross-sectional view and a stepped portion 13c is formed in this bent area. In addition, the one end of the heat pipe 5 is sandwiched between a top surface of this stepped portion 13c and the heat sink 4. In the configuration illustrated in FIG. 7, heat generated from the heat-generating component 10 is transferred to the heat sink 4 and the heat pipe 5 through the shield plate 13. Thus, addition of a new component for thermal conduction is not required. As a result, the number of required components is reduced, whereby simplification and a reduction in weight can be achieved in the configuration. Additionally, the heat-generating component 10 does not overlap the heat pipe 5 and therefore the portable electronic device can be made thinner.

Figure 8:
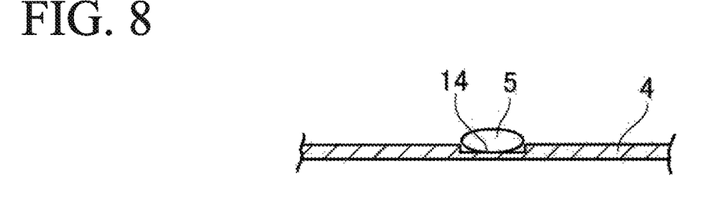
FIG. 8 is a partial cross-sectional view illustrating an example where the heat pipe is arranged in a groove formed in the heat sink.

As described earlier, the heat pipe 5 functions so as to increase the apparent thermal conductivity of the heat sink 4. Accordingly, even in a case where a cross-sectional area of a place in the heat sink 4 to which the heat pipe 5 is attached is smaller than that of other areas, the thermal conduction of the heat sink 4 is not deteriorated as a whole. From such a viewpoint, as illustrated in FIG. 8, a groove 14 may be formed in the heat sink 4 such that the heat pipe 5 is arranged within the groove 14. Assuming that the heat sink 4 has a thickness of approximately 0.2 mm to 0.3 mm and the flat heat pipe 5 has a thickness of approximately 0.5 mm to 0.7 mm, the depth of the groove 14 can be set to approximately 0.1 mm. With this, an increase in thickness caused when the flat heat pipe 5 is affixed to the heat sink 4 can be suppressed, consequently leading to a reduction in the entire thickness of the portable electronic device.

Figure 9:
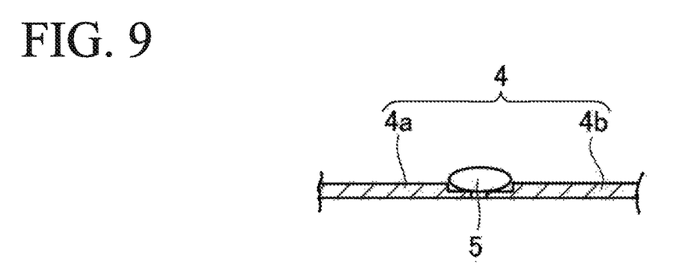
FIG. 9 is a partial cross-sectional view illustrating an example where the heat pipe is arranged in a groove formed by divided plates.

When the heat sink 4 is constituted by a plurality of divided plates 4a and 4b arranged adjacent to each other in parallel as illustrated in FIG. 9, thin portions may be formed in side edge portions of the respective divided plates 4a and 4b such that the thin portions form the aforementioned groove 14 by arranging the thin portions adjacent to each other at a predetermined interval. A gap between the divided plates 4a and 4b is closed by the heat pipe 5, which does not act as an obstacle in any way.

Figure 10:
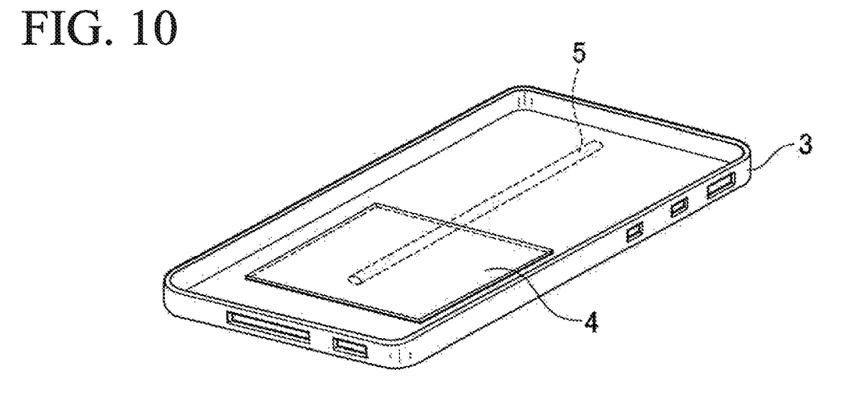
FIG. 10 is a schematic perspective view illustrating an example here the heat sink is integrated into a rear cover using insert molding.

The aforementioned heat sink 4 is a component functioning so as to disperse heat generated from the heat-generating component 10 and lower the temperature of the hot spot, while functioning so as to radiate the heat to the outside through the front cover or the rear cover 3 of the case 1. When focusing on the importance of the heat radiation function, it is preferable that one surface of the heat sink 4 be exposed to the outside of the case 1. An example of such a configuration is schematically illustrated in FIG. 10. The example here illustrates a case where the rear cover 3 is formed using synthetic resin and the heat sink 4 made of metal is formed within a portion of the rear cover 3 through insert molding such that the rear cover 3 and the heat sink 4 are integrated. The heat pipe 5 is arranged along the heat sink 4 and at least a portion of the heat pipe 5 is bonded to the heat sink 4 such that heat can be transferred. In such a configuration, heat can be directly diffused to the outside from the heat sink 4. Therefore, cooling performance is further enhanced, whereby the hot spot can be cleared or the temperature of the hot spot can be lowered. Additionally, the heat sink 4 does not overlap the rear cover 3 and thus the entire thickness of the portable electronic device can be made thinner.

The invention claimed is:

1. A cooling structure for a portable electronic device configured to accommodate, within a case having a sealing structure, a substrate on which a heat-generating component that generates heat during operation is mounted, and provided with a heat sink that diffuses the heat from the heat-generating component to a first place away from the heat-generating component, wherein
the heat sink is arranged at an inner surface of a front cover of the case or an inner surface of a rear cover of the case, and
a flat heat pipe is disposed such that one end of the flat heat pipe is arranged at a position for receiving the heat from the heat-generating component and another end of the flat heat pipe is arranged so as to be in close contact with the heat sink,
the cooling structure for the portable electronic device further comprising a shield plate which comprises a top surface, a stepped portion, and a leg portion, and the top surface, the stepped portion, and the leg portion cover the heat-generating component,
the stepped portion is bent toward the substrate such that a thickness of the shield plate is smaller than a thickness of the heat-generating component at a second place shifted away from the heat-generating component in a width direction or a length direction of the heat-generating component, the one end of the flat heat pipe being sandwiched between the stepped portion and the heat sink, wherein
the leg portion extends from the top surface to the substrate,
a face of the stepped portion closest to the heat generating component is parallel to a face of the leg portion closest to the heat generating component,
wherein the leg portion extends from the substrate to the top surface in a direction perpendicular to the top surface and the substrate, and
wherein the shield plate is between the heat generating component and the heat sink,
wherein the stepped portion comprises a first leg portion, a surface portion and a second leg portion,
wherein the first leg portion and the second leg portion are parallel to the leg portion and are perpendicular to the surface portion,
wherein the surface portion comprises the flat heat pipe thereon and is spaced away from each of and is between the heat sink and the substrate,
wherein the first leg portion is extended from the heat sink to a first side of the surface portion,
wherein the second leg portion is extended from the substrate to a second side of the surface portion opposite to the first side, and
wherein the first leg portion and the second leg portion are extended from the surface portion in opposite directions.

2. The cooling structure for the portable electronic device according to claim 1, wherein the heat sink has a thinner plate thickness at a place where the flat heat pipe is bonded than a plate thickness at a place where the flat heat pipe is not bonded.

3. The cooling structure for the portable electronic device according to claim 1, wherein the case is formed using synthetic resin, the heat sink is formed using metal, and the heat sink is built into a portion of the case so as to be integrated into the case.

4. The cooling structure for the portable electronic device according to claim 2, wherein the case is formed using synthetic resin, the heat sink is formed using metal, and the heat sink is built into a portion of the case so as to be integrated into the case.

5. The cooling structure according to claim 1, wherein the leg portion is directly coupled to the substrate.

6. The cooling structure according to claim 1, wherein a direction, in which the leg portion extends from the top surface to the substrate, is perpendicular to the heat sink.

7. The cooling structure according to claim 1, wherein, in a direction in which the leg portion extends from the top surface to the substrate, a length of the leg portion from the substrate to the top surface is equal to a length of the heat generating component from the substrate to the top surface.

8. The cooling structure according to claim 1, wherein
the top surface and the leg portion both have flat surfaces which are disposed parallel to the heat sink and the substrate, and
the top surface is provided out of plane with the leg portion.

9. The cooling structure according to claim 1, wherein
the stepped portion comprises a plurality of faces, including the face of the stepped portion, and
in a direction from the heat generating component to a furthest one of the plurality of faces of the stepped portion furthest from the heat generating component, the plurality of faces of the stepped portion are sequentially stepped from closer to the heat sink to closer to the substrate such that the face of the stepped portion closest to the heat generating component is directly connected to the heat sink and a further face of the plurality of faces of the stepped portion is directly connected to the substrate, and
the further face of the stepped portion directly connected to the substrate is a furthest one of the plurality of faces away from the heat generating component.

10. The cooling structure according to claim 9, wherein the first leg portion is both closer to the heat generating component than the second leg portion and also comprises the face of the stepped portion closest to the heat generating component,
the flat heat pipe is arranged on the surface portion.

11. The cooling structure according to claim 1, wherein the stepped portion and the leg portion cover opposite, parallel sides of the heat generating component in a direction of a shortest distance from the heat sink to the substrate.

12. The cooling structure according to claim 1,
wherein the heat pipe is between the heat sink and a first portion of the shield plate,
wherein a second portion of the shield plate is in direct contact with the heat sink, and
wherein at least a portion of the heat pipe overlaps a same height, from the substrate and towards the heat sink, as a portion of the heat generating component.

\* \* \* \* \*